US009331199B2

(12) United States Patent
Cho et al.

(10) Patent No.: US 9,331,199 B2
(45) Date of Patent: May 3, 2016

(54) SEMICONDUCTOR DEVICE

(71) Applicant: Samsung Electronics Co., Ltd., Suwon-si, Gyeonggi-do (KR)

(72) Inventors: Keun-Hwi Cho, Seoul (KR); Sung-Il Park, Suwon-si (KR); Byoung-Hak Hong, Seoul (KR); Toshinori Fukai, Suwon-si (KR); Mun-Hyeon Kim, Seoul (KR); Woong-Gi Kim, Hwaseong-si (KR); Sue-Hye Park, Seoul (KR); Dong-Won Kim, Seongnam-si (KR); Dae-Won Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/667,810

(22) Filed: Mar. 25, 2015

(65) Prior Publication Data

US 2016/0043222 A1    Feb. 11, 2016

(30) Foreign Application Priority Data

Aug. 6, 2014 (KR) .......................... 10-2014-0101221

(51) Int. Cl.
| | |
|---|---|
| *H01L 29/76* | (2006.01) |
| *H01L 29/94* | (2006.01) |
| *H01L 29/78* | (2006.01) |
| *H01L 27/092* | (2006.01) |
| *H01L 29/423* | (2006.01) |

(Continued)

(52) U.S. Cl.
CPC .......... *H01L 29/7845* (2013.01); *H01L 27/088* (2013.01); *H01L 27/092* (2013.01); *H01L 29/0649* (2013.01); *H01L 29/42356* (2013.01)

(58) Field of Classification Search
CPC ................... H01L 27/0922; H01L 21/823871
USPC ........................................................ 257/369
See application file for complete search history.

(56) References Cited

U.S. PATENT DOCUMENTS

| | | | |
|---|---|---|---|
| 7,442,601 | B2 | 10/2008 | Pei et al. |
| 7,943,961 | B2 | 5/2011 | Wang et al. |

(Continued)

FOREIGN PATENT DOCUMENTS

| | | |
|---|---|---|
| JP | 2008-294355 | 12/2008 |
| KR | 10-2005-0065139 A | 6/2005 |

(Continued)

*Primary Examiner* — Theresa T Doan
(74) *Attorney, Agent, or Firm* — Myers Bigel & Sibley, P.A.

(57) ABSTRACT

Provided is a semiconductor device to which a pattern structure for performance improvement is applied. The semiconductor device includes first and second active regions spaced apart from each other in a first direction with an isolation layer interposed therebetween, a first normal gate formed on the first active region to extend in a second direction crossing the first direction, a first dummy gate having a portion overlapping with one end of the isolation layer and the other portion overlapping with the first active region and spaced apart from the first normal gate in the first direction, a second dummy gate having a portion overlapping with the other end of the isolation layer and the other portion overlapping with the second active region, a first normal source/drain contact formed on a source/drain region between the first normal gate and the first dummy gate, and a dummy contact formed on the isolation layer so as not to overlap with the first and second dummy gates and having a different size from the first normal source/drain contact.

20 Claims, 27 Drawing Sheets

(51) Int. Cl.
*H01L 27/088* (2006.01)
*H01L 29/06* (2006.01)

(56) References Cited

U.S. PATENT DOCUMENTS

| | | | |
|---|---|---|---|
| 7,958,465 | B2 | 6/2011 | Lu et al. |
| 8,321,828 | B2 | 11/2012 | Chern |
| 8,350,253 | B1 | 1/2013 | Zhu et al. |
| 8,354,726 | B2 | 1/2013 | Tsutsui |
| 8,664,725 | B1 | 3/2014 | Venkitachalam et al. |
| 2007/0063223 | A1 | 3/2007 | Choi |
| 2008/0296700 | A1 | 12/2008 | Kang |
| 2011/0115000 | A1* | 5/2011 | Yang .................. 257/288 |
| 2011/0147855 | A1* | 6/2011 | Joshi et al. ............ 257/384 |
| 2014/0061801 | A1 | 3/2014 | Doornbos et al. |
| 2014/0070352 | A1 | 3/2014 | Tsai et al. |

FOREIGN PATENT DOCUMENTS

| KR | 10-2009-0022766 A | 3/2009 |
|---|---|---|
| KR | 10-2012-0033522 A | 4/2012 |

* cited by examiner

SEMICONDUCTOR DEVICE

CROSS-REFERENCE TO RELATED APPLICATION

This application claims priority from Korean Patent Application No. 10-2014-0101221 filed on Aug. 6, 2014 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device, and more particularly to a semiconductor device including a pattern structure for improving performance.

2. Discussion of Related Art

Along with the trend toward micro-fabrication of a semiconductor manufacturing process, micro-patterning is becoming difficult to achieve more and more. Accordingly, it is necessary to propose methods for overcoming difficulties in micro-patterning and improving performance of a miniaturized semiconductor device.

SUMMARY

The present disclosure provides a semiconductor device to which a pattern structure for performance improvement of a miniaturized semiconductor device is applied.

According to some embodiments of the present invention, there is provided a semiconductor device including first and second active regions spaced apart from each other in a first direction with an isolation layer interposed therebetween, a first normal gate formed on the first active region to extend in a second direction crossing the first direction, a first dummy gate having a portion overlapping one end of the isolation layer and the other portion overlapping the first active region and spaced apart from the first normal gate in the first direction, a second dummy gate having a portion overlapping the other end of the isolation layer and the other portion overlapping the second active region, a first normal source/drain contact formed on a source/drain region between the first normal gate and the first dummy gate, and a dummy contact formed on the isolation layer so as not to overlap the first and second dummy gates and having a different size from the first normal source/drain contact.

A distance between the first normal gate and the first dummy gate can be equal to a distance between the first dummy gate and the second dummy gate.

The first normal gate and the first dummy gate may include the same metal.

The first normal gate and the first dummy gate may have the same size.

The dummy contact may include a metallic material that applies compressive stress to the first active region disposed under the first normal gate.

The dummy contact may include a metallic material that applies tensile stress to the first active region disposed under the first normal gate.

The semiconductor device may further comprise a second normal gate formed on the second active region to extend in the second direction and spaced apart from the second dummy gate in the first direction; and a second normal source/drain contact formed on a source/drain region between the second normal gate and the second dummy gate.

According to some embodiments of the present invention, there is provided a semiconductor device including a substrate including a first region and a second region, first and second active regions disposed in the first region and spaced apart from each other in a first direction with a first isolation layer interposed therebetween, a first normal gate formed on the first active region to extend in a second direction crossing the first direction, a first normal source/drain contact formed on a first source/drain region disposed at one side of the first normal gate, a first dummy contact formed on the first isolation layer and having a larger size than the first normal source/drain contact, third and fourth active regions disposed on the second region and spaced apart from each other in the first direction with a second isolation layer interposed therebetween, a second normal gate formed on the second active region to extend in the second direction, a second normal source/drain contact formed on a second source/drain region disposed at one side of the second normal gate, and a second dummy contact formed on the second isolation layer and having a larger size than the second normal source/drain contact.

The first region includes an NMOS region and the second region may include a PMOS region.

The first dummy contact may have a larger size than the second dummy contact.

According to some embodiments of the present invention, there is provided a semiconductor device including first and second active regions spaced apart from each other in a first direction with a first isolation layer interposed therebetween, a first normal gate formed on the first active region to extend in a second direction crossing the first direction, a first dummy gate having a portion overlapping one end of the isolation layer and the other portion overlapping the first active region and spaced apart from the first normal gate in the first direction, and a second dummy gate having a portion overlapping the other end of the isolation layer and the other portion overlapping the second active region, wherein the first and second dummy gates have a different width from the first normal gate in the first direction.

A distance between the first normal gate and the first dummy gate can be different from a distance between the first dummy gate and the second dummy gate.

The semiconductor device may further comprise a second normal gate formed on the second active region to extend in the second direction; and a third dummy gate formed on the first active region and spaced apart from the first dummy gate with the first normal gate interposed therebetween.

A distance between the third dummy gate and the first normal gate can be equal to a distance between the first normal gate and the first dummy gate.

The semiconductor device may further comprise a first normal source/drain contact formed on a source/drain region between the third dummy gate and the first normal gate; a second normal source/drain contact formed on a source/drain region between the first normal gate and the first dummy gate; and a third normal source/drain contact formed on a source/drain region between the second dummy gate and the second normal gate.

A width of the third dummy gate can be equal to that of the first dummy gate in the first direction.

The first dummy gate and the second dummy gate can be positioned to be adjacent to each other.

The first and second dummy gates may include the same metallic material with the first normal gate.

The first and second dummy gates may include a metallic material that applies compressive stress to the first active region disposed under the first normal gate.

The first and second dummy gates may include a metallic material that applies tensile stress to the first active region disposed under the first normal gate.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE EMBODIMENTS

Figure 1:
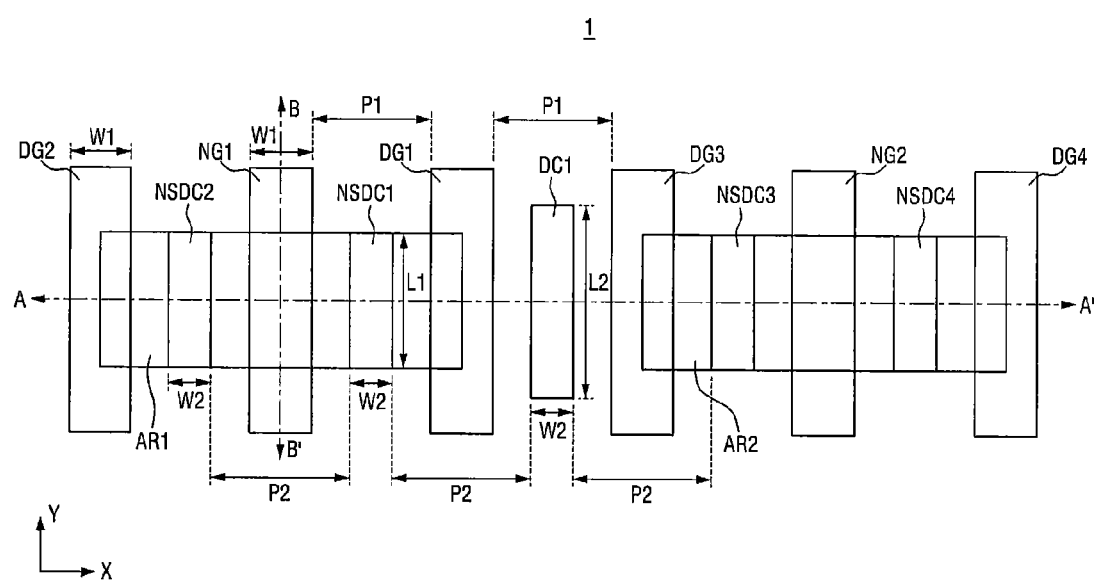
FIG. 1 is a plan view of a semiconductor device according to some embodiments of the present invention.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Some embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor device 1 according to some embodiments of the present invention will be described with reference to FIGS. 1 to 3.

The semiconductor device 1 according to some embodiments of the present invention can be an NMOS transistor. FIGS. 1 to 3 are provided for illustrating relationships between each of normal gates, dummy gates, dummy contacts, normal source/drain contacts, and active regions, and descriptions of source/drain regions, spacers and interlayer insulation layers will not be given.

Figure 2:
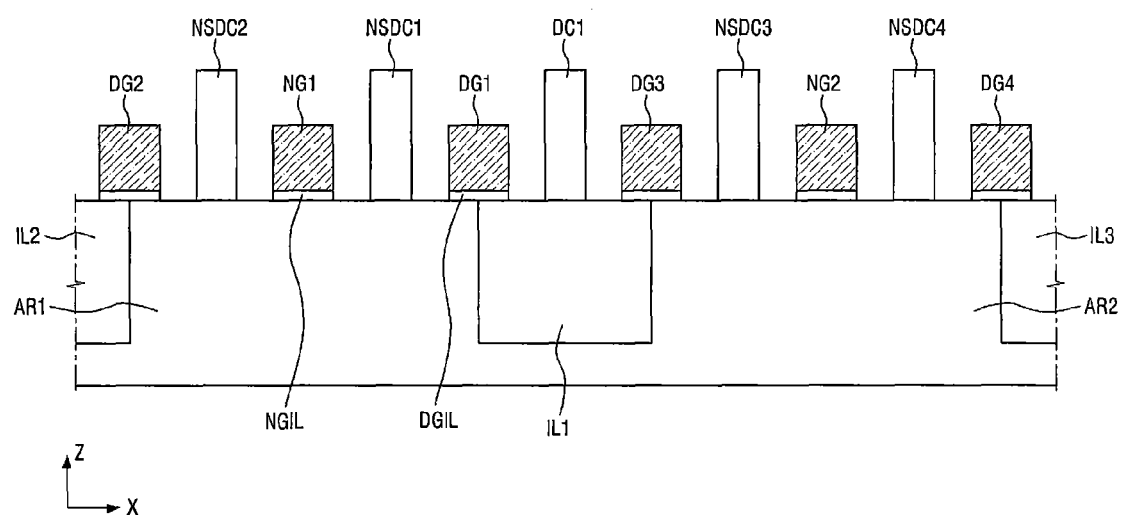
FIG. 2 is a cross-sectional view taken along the line AA' of FIG. 1.
Figure 3:
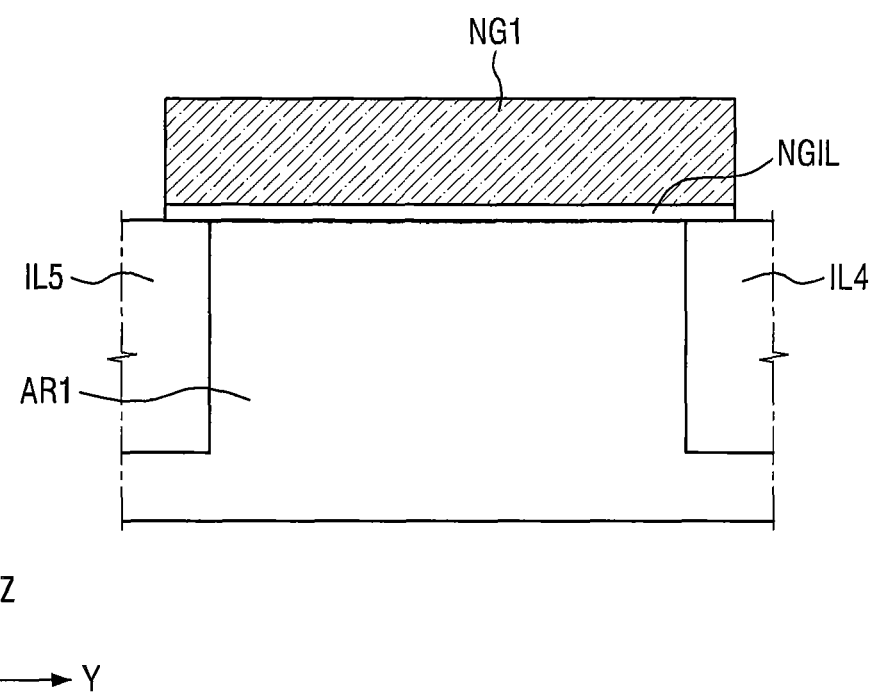
FIG. 3 is a cross-sectional view taken along the line BB' of FIG. 1.

FIG. 1 is a plan view of a semiconductor device 1 according to some embodiments of the present invention, FIG. 2 is a cross-sectional view taken along the line AA' of FIG. 1, and FIG. 3 is a cross-sectional view taken along the line BB' of FIG. 1.

Referring to FIG. 1, the semiconductor device 1 may include first and second active regions AR1 and AR2, first and second normal gates NG1 and NG2, first to fourth dummy gates DG1 to DG4, first to fourth normal source/drain contacts NSDC1 to NSDC4, and a first dummy contact DC1. Here, numbers of active regions, normal gates, dummy gates, normal source/drain contacts, and dummy contacts are illustrated by way of example, but aspects of the present invention are not limited thereto. In addition, since various components on the first active region AR1 and various components on the second active region AR2 are symmetrically arranged in view of a first isolation layer (IL1 of FIG. 2), the following description will focus on the components on the first active region AR1.

In detail, the first and second active regions AR1 and AR2 may be spaced apart from each other in a first direction X with a first isolation layer (IL1 of FIG. 2) interposed therebetween.

In addition, the first and second active regions AR1 and AR2 may include, for example, one or more semiconductor materials selected from the group comprising Si, Ge, SiGe, GaP, GaAs, SiC, SiGeC, InAs and InP. Alternatively, the first and second active regions AR1 and AR2 may have a silicon on insulator (SOI) structure. In addition, the first and second active regions AR1 and AR2 may have epitaxial layers formed on a base substrate.

The first and second normal gates NG1 and NG2 may be formed on the first and second active regions AR1 and AR2 to extend in a second direction Y crossing the first direction X. Here, since the first and second normal gates NG1 and NG2 are symmetrically arranged in view of the first dummy contact DC1 and have the same characteristics with each other, the following description will focus on the first normal gate NG1.

The first normal gate NG1 is disposed between the first and second dummy gates DG1 and DG2. A distance between the first dummy gate DG1 and the first normal gate NG1 in first direction X may be equal to a first distance P1 between the second dummy gate DG2 and the first normal gate NG1 in the first direction X. A width of the first normal gate NG1 in the first direction X may be a first width W1 equal to widths of the first and second dummy gates DG1 and DG2 in the first direction X. Further, the first normal gate NG1 may have the same size with the first and second dummy gates DG1 and DG2.

The first normal gate NG1 may include, for example, a metal, specifically W or TiN, but not limited thereto. The first normal gate NG1 may include the same metal with the first and second dummy gates DG1 and DG2.

The first and second dummy gates DG1 and DG2 may be formed on the first active region AR1 and the third and fourth dummy gates DG3 and DG4 may be formed on the second active region AR2. Here, since the first and second dummy gates DG1 and DG2 and the third and fourth dummy gates DG3 and DG4 are symmetrically arranged in view of the first dummy contact DC1, the following description will focus on the first and second dummy gates DG1 and DG2.

The first dummy gate DG1 may have a portion overlapping with one end of the first isolation layer (IL1 of FIG. 2) and the other portion overlapping with the first active region AR1. The first dummy gate DG1 may be spaced apart from the first normal gate NG1 in the first direction X at the first distance P1, and the second dummy gate DG2 may also be spaced apart from the first normal gate NG1 in the first direction X at the first distance P1.

The first and second dummy gates DG1 and DG2 may include, for example, a metal, specifically W or TiN, but not limited thereto. The first and second dummy gates DG1 and DG2 may include the same metal with the first normal gate NG1.

The third dummy gate DG3 may have a portion overlapping with the other end of the first isolation layer (IL1 of FIG. 2) and the other portion overlapping with the second active region AR2. A distance between the third dummy gate DG3 and the first dummy gate DG1 in the first direction X may be equal to the first distance P1.

The first and second normal source/drain contacts NSDC1 and NSDC2 may be formed on the first active region AR1, and the third and fourth normal source/drain contacts NSDC3 and NSDC4 may be formed on the second active region AR2. Here, since the first and second normal source/drain contacts NSDC1 and NSDC2 and the third and fourth normal source/drain contacts NSDC3 and NSDC4 are symmetrically arranged in view of the first dummy contact DC1 and have the same characteristics with each other, the following description will focus on the first and second normal source/drain contacts NSDC1 and NSDC2.

The first normal source/drain contact NSDC1 is formed on a source/drain region between the first normal gate NG1 and the first dummy gate DG1. The second normal source/drain contact NSDC2 is formed on a source/drain region between the first normal gate NG1 and the second dummy gate DG2.

Lengths of the first and second normal source/drain contacts NSDC1 and NSDC2 in the second direction Y may be equal to each other, that is, a first length L1, and widths thereof in the first direction X may also be equal to each other, that is, a second width W2. A distance between the first and second normal source/drain contacts NSDC1 and NSDC2 in the first direction X and a distance between the first normal source/drain contact NSDC1 and the first dummy contact DC1 may also be equal to each other, that is, a second distance P2.

Here, a distance between the third normal source/drain contact NSDC3 and the first dummy contact DC1 in the first direction X may also be equal to each other, that is, the second distance P2.

The first to fourth normal source/drain contacts NSDC1 to NSDC4 may include, for example, a metal, specifically W or TiN, but not limited thereto. The first to fourth normal source/drain contacts NSDC1 to NSDC4 may include the same metal with the first dummy contact DC1.

The first dummy contact DC1 may be formed on the first isolation layer (IL1 of FIG. 2) while not overlapping with the first and second dummy gates DG1 and DG2, and may have different size from the first normal source/drain contact NSDC1.

For example, the first dummy contact DC1 may be spaced apart from the first normal source/drain contact NSDC1 in the first direction X at the second distance P2 and may be spaced apart from the third normal source/drain contact NSDC3 in the first direction X at the second distance P2. A width of the first dummy contact DC1 in the first direction X may be equal to widths of the first to fourth normal source/drain contacts NSDC1 to NSDC4, that is, the second width W2. However, a length of the first dummy contact DC1 in the second direction Y, that is, a second length L2, may be greater than the lengths of the first to fourth normal source/drain contacts NSDC1 to NSDC4 in the second direction Y, that is, the first length L1, but aspects of the present invention are not limited thereto. A width of the first dummy contact DC1 in the first direction X may be greater than widths of the first to fourth normal source/drain contacts NSDC1 to NSDC4. Consequently, the first dummy contact DC1 may have a larger size than the first to fourth normal source/drain contacts NSDC1 to NSDC4.

The first dummy contact DC1 may include the same metal with the first to fourth normal source/drain contacts NSDC1 to NSDC4, specifically W, but aspects of the present invention are not limited thereto.

Since the semiconductor device 1 is an NMOS transistor, a channel region of the first active region AR1 disposed under the first normal gate NG1 may have improved performance as tensile stress is increased. Therefore, the first dummy contact DC1 may include a metallic material that applies compressive stress to the channel region of the first active region AR1 disposed under the first normal gate NG1. This is because the compressive stress applied by the first dummy contact DC1 may serve as tensile stress from the viewpoint of the channel region of the first active region AR1 disposed under the first normal gate NG1.

Therefore, in order to apply larger compressive stress, the first dummy contact DC1 may have a larger size than the first to fourth normal source/drain contacts NSDC1 to NSDC4 and may include a metallic material that applies compressive stress.

Here, the first dummy contact DC1 may also apply compressive stress to a channel region of the second active region AR2 disposed under the second normal gate NG2.

As described above, since the semiconductor device 1 includes the first dummy contact DC1 including a metallic material that applies compressive stress and arranged at uniform intervals from the normal source/drain contacts NSDC1 to NSDC4, the tensile stress applied to the channel regions disposed under the normal gates NG1 and NG2 may be increased, thereby improving performance of the semiconductor device 1 (for example, mobility of carriers in the channel region).

When the semiconductor device 1 is a PMOS transistor and the first dummy contact DC1 includes a metallic material that applies tensile stress, the performance of the semiconductor device 1 may also be improved.

When the semiconductor device 1 is a PMOS transistor, the performance of the semiconductor device 1 may be improved as the channel region of the first active region AR1 disposed under the first normal gate NG1 has increased compressive stress. Therefore, the larger the first dummy contact DC1 including a metallic material that applies tensile stress, the more the compressive stress applied to the channel region of the first active region AR1, thereby improving the performance of the semiconductor device 1.

Referring to FIG. 2, the semiconductor device 1 being a planar transistor and having a gate-first structure is illustrated. Since the semiconductor device 1 is a planar transistor and has a gate-first structure, a normal gate insulation layer NGIL is disposed under each of the first and second normal gates NG1 and NG2, and a dummy gate insulation layer DGIL is disposed under each of the first to fourth dummy gates DG1 to DG4.

Referring to FIG. 3, the normal gate insulation layer NGIL and the first normal gate NG1 are planarly stacked on the first active region AR1.

Hereinafter, some embodiments of the semiconductor device 1 shown in FIG. 1 will be described with reference to FIGS. 4 and 5.

Figure 4:
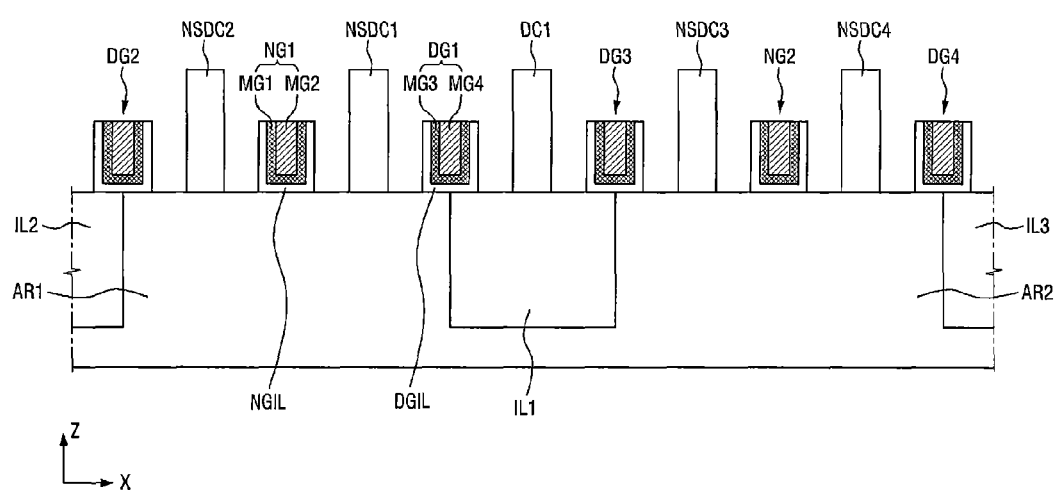
FIG. 4 is a cross-sectional view taken along the line AA' of FIG. 1.
Figure 5:
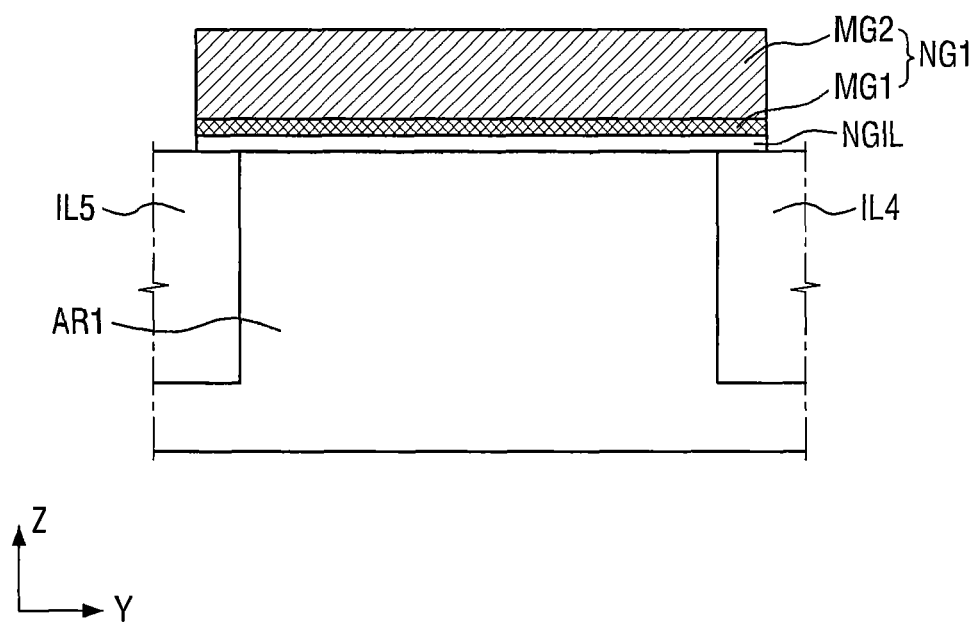
FIG. 5 is a cross-sectional view taken along the line BB' of FIG. 1.

FIG. 4 is a cross-sectional view taken along the line AA' of FIG. 1, and FIG. 5 is a cross-sectional view taken along the line BB' of FIG. 1.

Referring to FIG. 4, the semiconductor device 1 being a planar transistor but having a gate-last structure is illustrated.

In FIG. 4, the normal gate insulation layer NGIL and a first metal layer MG1 included in the first normal gate NG1 may be formed along sidewalls to extend in a third direction Z. The normal gate insulation layer NGIL and the first normal gate NG1 may be sequentially stacked, and the first normal gate NG1 may include the first and second metal layers MG1 and MG2.

As shown in FIG. 4, the first normal gate NG1 may be formed by stacking two or more metal layers MG1 and MG2. The first metal layer MG1 may function to adjust a work function, and the second metal layer MG2 may function to fill a space formed by the first metal layer MG1. For example, the first metal layer MG1 may include at least one of TiN, TaN, TiC, and TaC. In addition, the second metal layer MG2 may include W or Al.

Here, the second normal gate NG2 may have the same structure as the first normal gate NG1.

The first to fourth dummy gates DG1 to DG4 and the dummy gate insulation layer DGIL may also have the same structure as the first and second normal gates NG1 and NG2 and the normal gate insulation layer NGIL, and detailed descriptions thereof will not be given.

In FIG. 5, first and second metal layers MG1 and MG2 are sequentially stacked on the normal gate insulation layer.

Consequently, the normal gate insulation layer NGIL, the dummy gate insulation layer DGIL, the first and second normal gates NG1 and NG2, and the first to fourth dummy gates DG1 to DG4 may have such shapes as shown in FIGS. 4 and 5 because they are formed by a gate-last process.

Hereinafter, some embodiments of the semiconductor device 1 will be described with reference to FIGS. 6 and 7.

Figure 6:
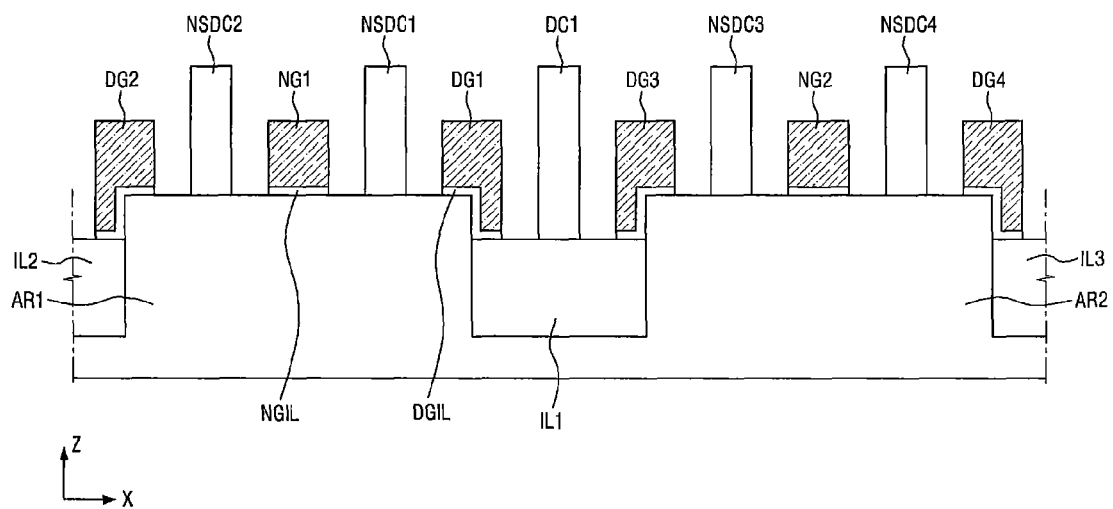
FIG. 6 is a cross-sectional view taken along the line AA' of FIG. 1.
Figure 7:
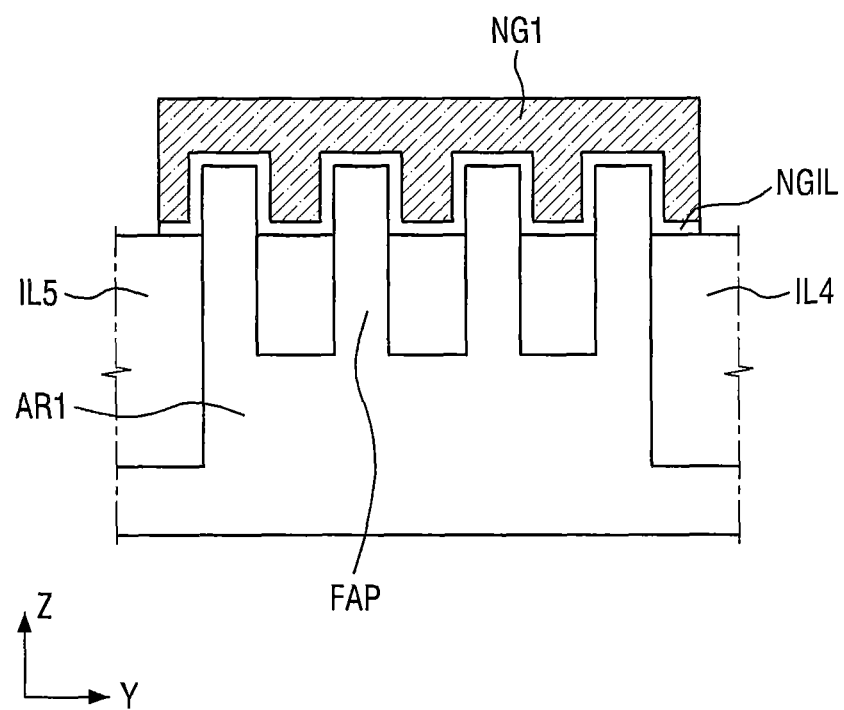
FIG. 7 is a cross-sectional view taken along the line BB' of FIG. 1.

FIG. 6 is a cross-sectional view taken along the line AA' of FIG. 1 and FIG. 7 is a cross-sectional view taken along the line BB' of FIG. 1.

Referring to FIG. 6, the semiconductor device 1 being a FinFET and having a gate-first structure is illustrated.

In FIG. 6, a top surface of a first isolation layer IL1 may be lower than a top surface of the first active region AR1. Accordingly, the dummy gate insulation layer DGIL may have a portion formed along sidewalls of the first active region AR1, and first and second dummy gates DG1 and DG2 may have different shapes from those shown in FIG. 2.

Referring to FIG. 7, a fin type active pattern FAP is formed to protrude on a first active region AR1 and a normal gate insulation layer NGIL may also be formed to protrude along the protruding fin type active pattern FAP. Accordingly, a first normal gate NG1 formed on the normal gate insulation layer NGIL may also have a different from that shown in FIG. 3.

Hereinafter, some embodiments of the semiconductor device 1 will be described with reference to FIGS. 8 and 9.

Figure 8:
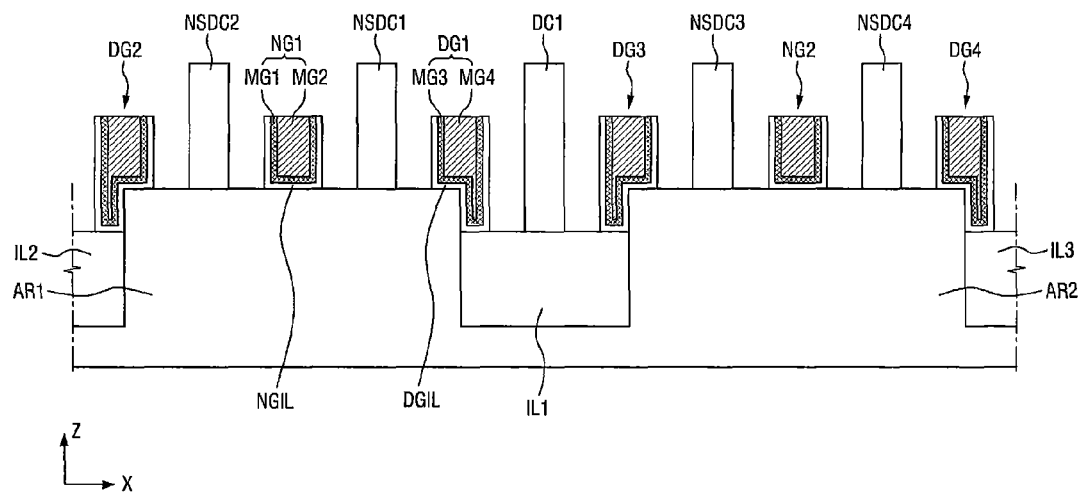
FIG. 8 is a cross-sectional view taken along the line AA' of FIG. 1.
Figure 9:
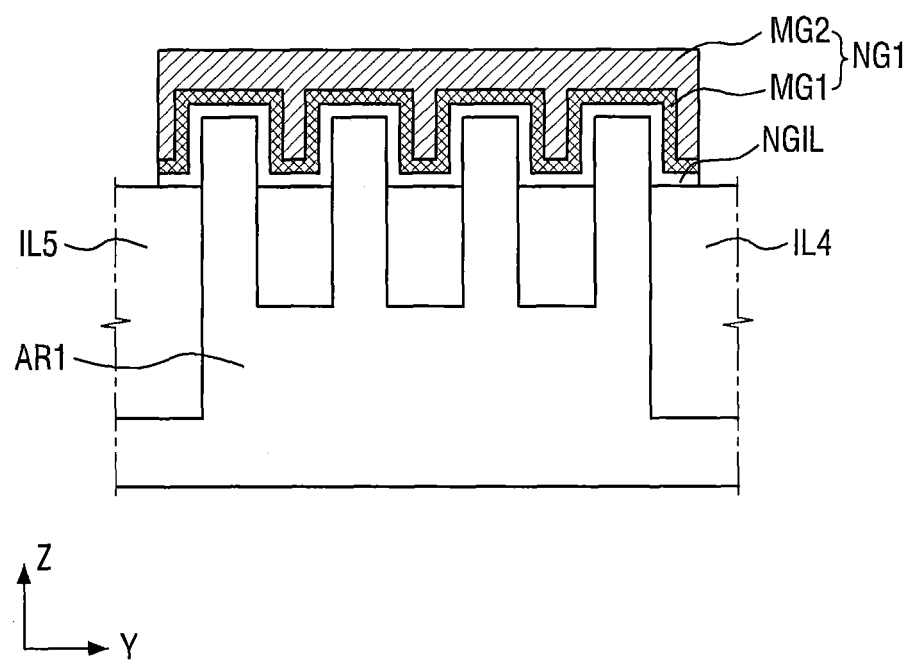
FIG. 9 is a cross-sectional view taken along the line BB' of FIG. 1.

FIG. 8 is a cross-sectional view taken along the line AA' of FIG. 1 and FIG. 9 is a cross-sectional view illustrating some embodiments, taken along the line BB' of FIG. 1.

Referring to FIG. 8, the semiconductor device 1 being a FinFET but having a gate-last structure is illustrated.

Accordingly, first and second normal gates NG1 and NG2 may include two or more metal layers MG1 and MG2, and first to fourth dummy gates DG1 to DG4 may also include two or more metal layers MG3 and MG4. In FIG. 8, a normal gate insulation layer NGIL and a dummy gate insulation layer DGIL extend along sidewalls in a third direction Z.

In FIG. 9, first and second metal layers MG1 and MG2 sequentially stacked on the normal gate insulation layer NGIL are illustrated.

Consequently, the semiconductor device 1 shown in FIGS. 8 and 9 is a FinFET adopting a gate-last process using structures of gates and gate insulation layers.

Hereinafter, a semiconductor device 2 according to some embodiments of the present invention will be described with reference to FIG. 10. The semiconductor device 2 according to some embodiments of the present invention can be a PMOS transistor.

Figure 10:
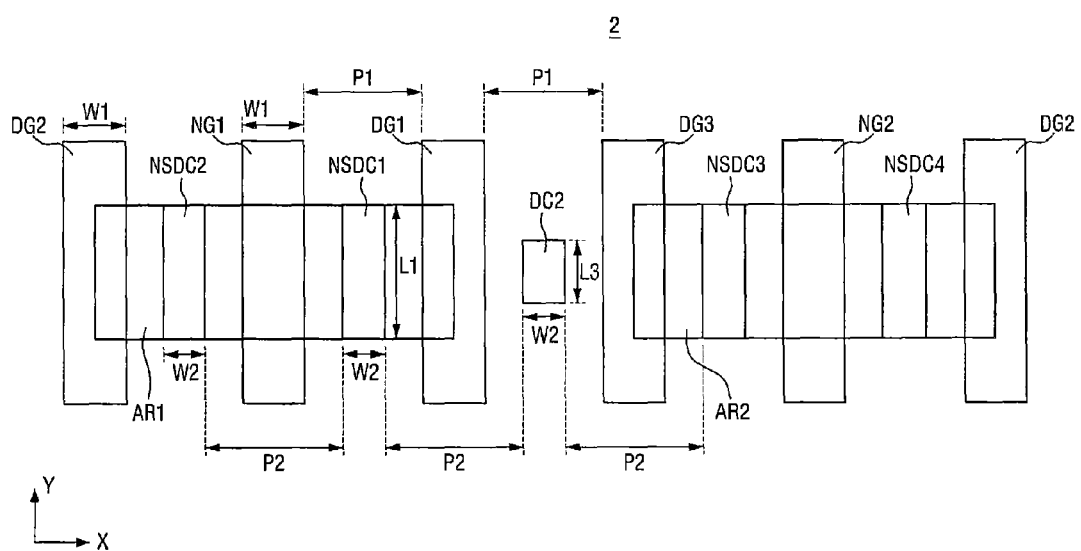
FIG. 10 is a plan view of a semiconductor device according to some embodiments of the present invention.

FIG. 10 is a plan view of a semiconductor device 2 according to some embodiments of the present invention.

Referring to FIG. 10, a second dummy contact DC2 has a smaller size than first to fourth normal source/drain contacts NSDC1 to NSDC4.

For example, a width of a second dummy contact DC2 in a first direction X may be equal to widths of first to fourth normal source/drain contacts NSDC1 to NSDC4, that is, a second width W2. However, a length of the second dummy contact DC2 in a second direction Y may be smaller than lengths of the first to fourth normal source/drain contacts NSDC1 to NSDC4 in the second direction Y, that is, a first length L1, which is provided only for illustration, but aspects of the present invention are not limited thereto.

Here, a distance between the second dummy contact DC2 and the first normal source/drain contact NSDC1 in the first direction X may be equal to a distance between the first and second normal source/drain contacts NSDC1 and NSDC2 in the first direction X, that is, a second distance P2.

That is to say, the semiconductor device 2 shown in FIG. 10 includes a dummy contact (that is, the second dummy contact DC2) having a smaller size than the first to fourth normal source/drain contacts NSDC1 to NSDC4.

Since the semiconductor device 2 is a PMOS transistor, performance of the semiconductor device 2 may be improved as a channel region of a first active region AR1 disposed under the first normal gate NG1 is less reduced. Therefore, if the second dummy contact DC2 includes a metallic material that applies compressive stress, less compressive stress is preferably applied to the channel region of the first active region AR1 disposed under the first normal gate NG1. This is because the compressive stress applied by the second dummy contact DC2 may serve as tensile stress from the viewpoint of the channel region of the first active region AR1 disposed under the first normal gate NG1, that is, tensile stress reducing the compressive stress applied to the channel region.

Therefore, even if the second dummy contact DC2 may include the same metal with the first to fourth normal source/drain contacts NSDC1 to NSDC4, it preferably has a smaller size than the first to fourth normal source/drain contacts NSDC1 to NSDC4 to apply reduced compressive stress.

As described above, since the semiconductor device 2 includes the second dummy contact DC2 arranged at uniform intervals from the normal source/drain contacts NSDC1 to NSDC4 and having a smaller size than the normal source/drain contacts NSDC1 to NSDC4, the compressive stress applied to the channel region disposed under the normal gates NG1 and NG2 may be less reduced. The second dummy contact DC2 is further provided between the first and third normal source/drain contacts NSDC1 and NSDC3, thereby providing a uniform density of contact patterns.

Even when the semiconductor device 2 is an NMOS transistor and the first dummy contact DC1 includes a metallic material that applies tensile stress, it is possible to allow the tensile stress applied to the channel region disposed under the normal gates NG1 and NG2 to be less reduced.

When the semiconductor device 1 is an NMOS transistor, the performance of the semiconductor device 1 may be improved as the tensile stress applied to the channel region of the first active region AR1 disposed under the first normal gate NG1 is increased. Therefore, less tensile stress applied to the channel region of the first active region AR1 may be less reduced as the first dummy contact DC1 including a metallic material that applies tensile stress has a smaller size.

A planar transistor, a FinFET, a gate-first structure, a gate-last structure may all be applied to the semiconductor device 2.

Hereinafter, a semiconductor device (3) according to some embodiments of the present invention will be described with reference to FIG. 11.

Figure 11:
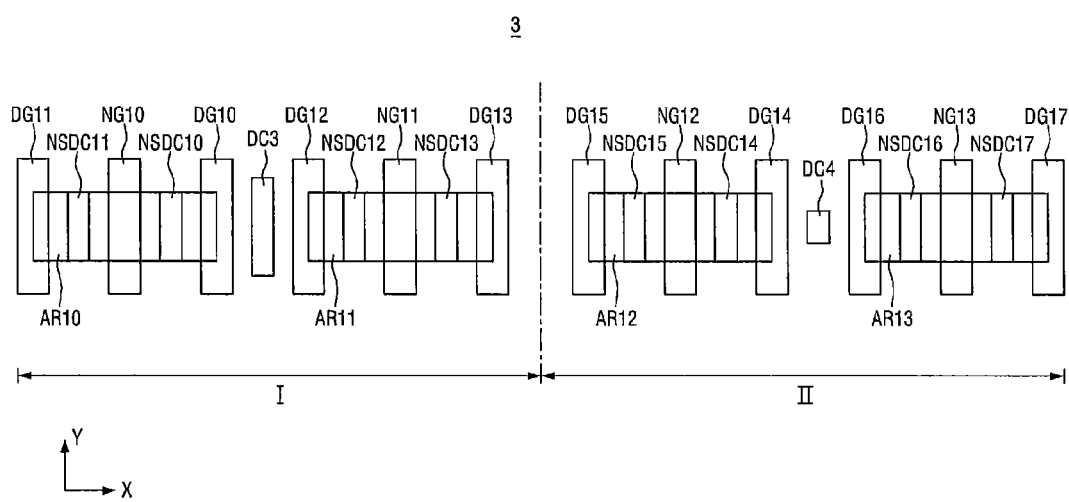
FIG. 11 is a plan view of a semiconductor device according to some embodiments of the present invention.

FIG. 11 is a plan view of a semiconductor device according to some embodiments of the present invention.

Referring to FIG. 11, the semiconductor device 3 according to some embodiments of the present invention may have a first region I and a second region II.

The semiconductor device 3 may include a CMOS transistor. In detail, the first region I may include one of a PMOS transistor and an NMOS transistor and the second region II may include the other of the PMOS transistor and the NMOS transistor.

For example, a third dummy contact DC3 of the first region I has a larger size than 10th to 13rd normal source/drain contacts NSDC10 to NSDC13, and a fourth dummy contact DC4 of the second region II has a smaller size than 14th to 17th normal source/drain contacts NSDC14 to NSDC17. Therefore, if the third and fourth dummy contacts DC3 and DC4 include a metallic material that applies compressive stress, the first region I may be an NMOS transistor and the second region II may be a PMOS transistor. Conversely, if the third and fourth dummy contacts DC3 and DC4 include a metallic material that applies tensile stress, the first region I may be a PMOS transistor and the second region II may be an NMOS transistor.

In other words, the semiconductor device 1 shown in FIG. 1 may be disposed in the first region I and the semiconductor device 2 shown in FIG. 10 may be disposed in the second region II.

Hereinafter, a semiconductor device 4 according to some embodiments of the present invention will be described with reference to FIG. 12. The semiconductor device 4 according to some embodiments of the present invention can be an NMOS transistor.

Figure 12:
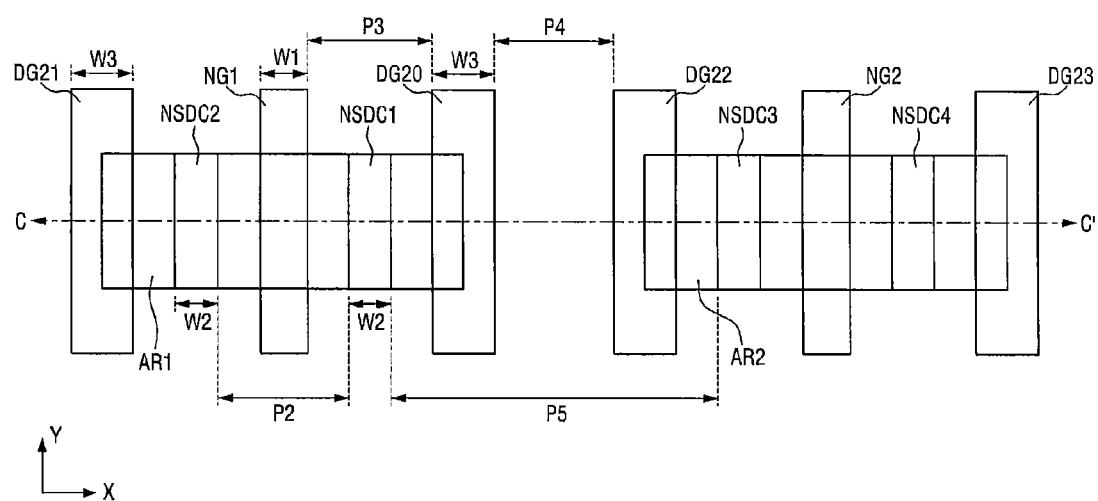
FIG. 12 is a plan view of a semiconductor device according to some embodiments of the present invention.

FIG. 12 is a plan view of a semiconductor device 4 according to some embodiments of the present invention.

Referring to FIG. 12, the semiconductor device 4 may include first and second active regions AR1 and AR2, first and second normal gates NG1 and NG2, 20th to 23rd dummy gates DG20 to DG23, and first to fourth normal source/drain contacts NSDC1 to NSDC4. Here, numbers of active regions, normal gates, dummy gates, and normal source/drain contacts are illustrated by way of example, but aspects of the present invention are not limited thereto. In addition, since various components on the first active region AR1 and various components on the second active region AR2 are symmetrically arranged in view of a first isolation layer (IL1 of FIG. 13), the following description will focus on the components on the first active region AR1.

The first and second active regions AR1 and AR2 may be spaced apart from each other in a first direction X with a first isolation layer (IL1 of FIG. 13) interposed therebetween.

The first and second active regions AR1 and AR2 may include, for example, one or more semiconductor materials selected from the group comprising Si, Ge, SiGe, GaP, GaAs, SiC, SiGeC, InAs and InP. Alternatively, the first and second active regions AR1 and AR2 may have a silicon on insulator (SOI) structure. In addition, the first and second active regions AR1 and AR2 may have epitaxial layers formed on a base substrate.

The first and second normal gates NG1 and NG2 may be formed on the first and second active regions AR1 and AR2 to extend in a second direction Y crossing the first direction X. Here, since the first and second normal gates NG1 and NG2 are symmetrically arranged in view of the first isolation layer (IL1 of FIG. 13) and have the same characteristics with each other, the following description will focus on the first normal gate NG1.

The first normal gate NG1 is disposed between the 20th and 21st dummy gates DG20 and DG21. A distance between the 20th dummy gate DG20 and the first normal gate NG1 in first direction X may be equal to a distance between the 21st dummy gate DG21 and the first normal gate NG1 in the first direction X, that is, a third distance P3. Here, the third distance P3 may be smaller than the first distance P1 shown in FIG. 1.

A width of the first normal gate NG1 in the first direction X may be a first width W1, which is smaller than widths of the 20th and 21st dummy gates DG20 and DG21 in the first direction X (that is, a third width W3).

The first normal gate NG1 may include, for example, a metal, specifically W or TiN, but not limited thereto. In addition, the first normal gate NG1 may include the same metal with the 20th and 21st dummy gates DG20 and DG21.

The 20th and 21st dummy gates DG20 and DG21 may be formed on the first active region AR1 and the 22nd and 23rd dummy gates DG22 and DG23 may be formed on the second active region AR2. Here, since the 20th and 21st dummy gates DG20 and DG21 and the 22nd and 23rd dummy gates DG22 and DG23 are symmetrically arranged in view of the first isolation layer (IL1 of FIG. 13), and have the same characteristics with each other, the following description will focus on the 20th and 21st dummy gates DG20 and DG21.

The 20th dummy gate DG20 may have a portion overlapping with one end of the first isolation layer (IL1 of FIG. 13) and the other portion overlapping with the first active region AR1. In addition, the 20th dummy gate DG20 may be spaced apart from the first normal gate NG1 in the first direction X at the third distance P3, and the 21st dummy gate DG21 may also be spaced apart from the first normal gate NG1 in the first direction X at the third distance P3.

The 20th and 21st dummy gates DG20 and DG21 may include, for example, a metal, specifically W or TiN, but not limited thereto. The 20th and 21st dummy gates DG20 and DG21 may include the same metal with the first normal gate NG1.

The 22nd dummy gate DG22 may have a portion overlapping with the other end of the first isolation layer (IL1 of FIG. 13) and the other portion overlapping with the second active region AR2. In addition, a distance between the 20th dummy gate DG20 and the 22nd dummy gate DG22 in the first direction X may be equal to a fourth distance P4, which is smaller than the third distance P3.

The first and second normal source/drain contacts NSDC1 and NSDC2 may be formed on the first active region AR1 and the third and fourth normal source/drain contacts NSDC3 and NSDC4 may be formed on the second active region AR2. Here, the first and second normal source/drain contacts NSDC1 and NSDC2 and the third and fourth normal source/drain contacts NSDC3 and NSDC4 are symmetrically arranged in view of the first isolation layer (IL1 of FIG. 13) and have the same characteristics with each other, the following description will focus on the first and second normal source/drain contacts NSDC1 and NSDC2.

The first normal source/drain contact NSDC1 is formed on a source/drain region (not shown) between the first normal gate NG1 and the 20th dummy gate DG20. The second normal source/drain contact NSDC2 is formed on a source/drain region between the first normal gate NG1 and the 21st dummy gate DG21.

Lengths of the first and second normal source/drain contacts NSDC1 and NSDC2 in the second direction Y may be equal to each other, that is, a first length L1, and widths thereof in the first direction X may also be equal to each other, that is, a second width W2. A distance between the first and second normal source/drain contacts NSDC1 and NSDC2 in the first direction X may be a second distance P2, and a distance between the first and third normal source/drain contact NSDC3 may be a fifth distance P5. The second distance P2 may be half of the fifth distance P5.

The first to fourth normal source/drain contacts NSDC1 to NSDC4 may include, for example, a metal, specifically W, but not limited thereto.

Since the semiconductor device 4 is an NMOS transistor, performance of the semiconductor device 4 may be improved as tensile stress applied to a channel region of the first active region AR1 disposed under the first normal gate NG1 is increased. Therefore, the 20th and 21st dummy gates DG20 and DG21 may include a metallic material that applies compressive stress to the channel region of the first active region AR1 disposed under the first normal gate NG1. This is because the compressive stress applied by 20th and 21st dummy gates DG20 and DG21 may serve as tensile stress from the viewpoint of the channel region of the first active region AR1 disposed under the first normal gate NG1.

Therefore, in order to apply larger compressive stress, the 20th and 21st dummy gates DG20 and DG21 may have a larger size than the first normal gate NG1 and may include a metallic material that applies compressive stress.

Here, the 22nd and 23rd dummy gates DG22 and DG23 may also apply compressive stress to a channel region of the second active region AR2 disposed under the second normal gate NG2.

As described above, since the semiconductor device 4 includes the dummy gates DG20 to DG23 having larger sizes than the normal gates NG1 and NG2 and including a metallic material that applies compressive stress to increase the tensile stress applied to the channel regions disposed under the normal gates NG1 and NG2, thereby improving performance of the semiconductor device 4 (for example, mobility of carriers in the channel region).

Even when the semiconductor device 4 is a PMOS transistor and the 20th to 23rd dummy gates DG20 to DG23 include a metallic material that applies tensile stress, performance of the semiconductor device 4 itself can be improved.

In detail, when the semiconductor device 4 is a PMOS transistor, the performance of the semiconductor device 4 may be improved as the compressive stress applied to the channel region of the first active region AR1 disposed under the first normal gate NG1 is increased. Therefore, as the 20th to 23rd dummy gates DG20 to DG23 including a metallic material that applies tensile stress have increased sizes, the compressive stress applied to the channel region of the first active region AR1 may be increased, thereby improving the performance of the semiconductor device 4.

Hereinafter, various embodiments of the semiconductor device 4 will be described with reference to FIGS. 13 to 16.

Figure 13:
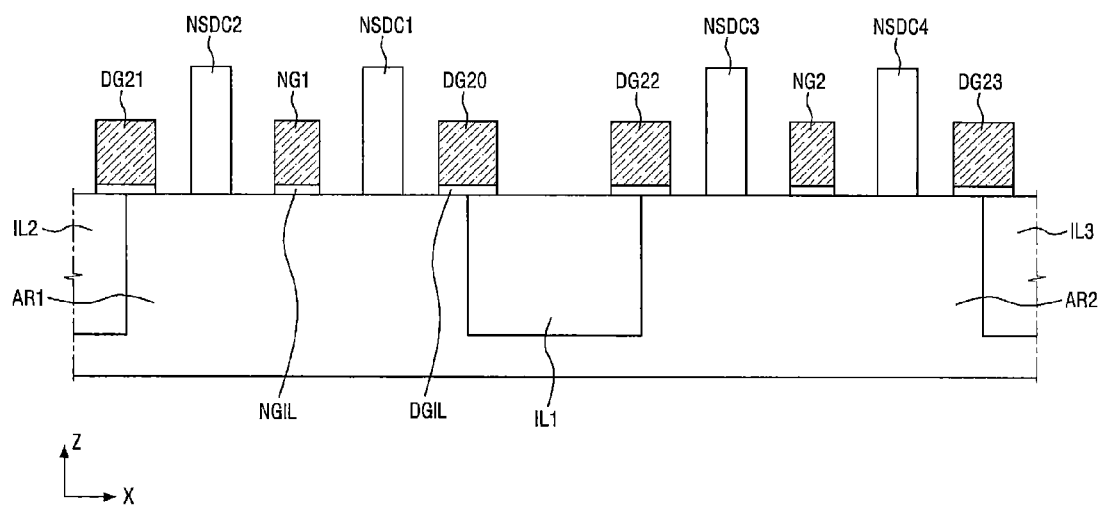
FIG. 13 is a cross-sectional view taken along the line CC' of FIG. 12.
Figure 14:
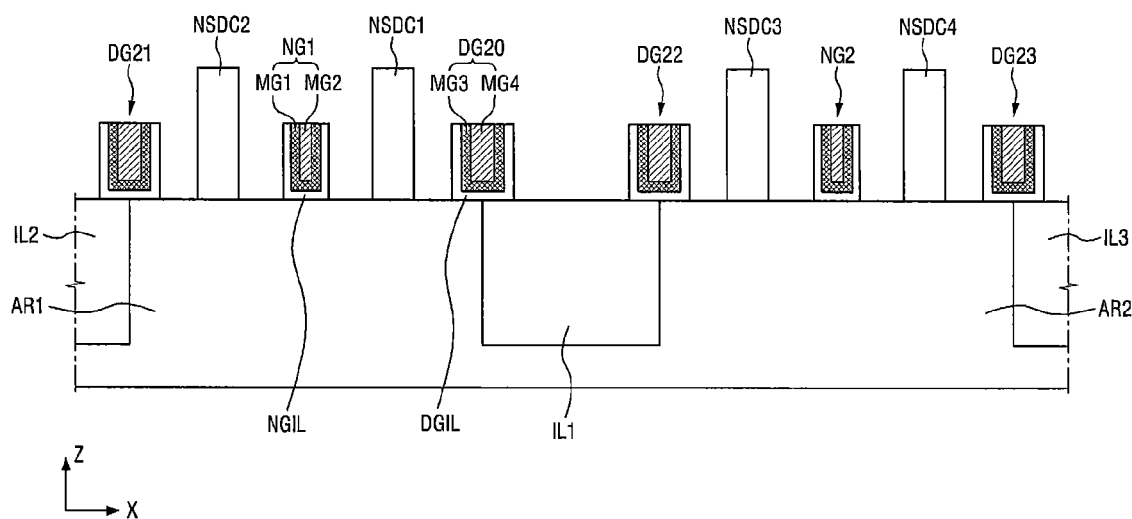
FIG. 14 is a cross-sectional view taken along the line CC' of FIG. 12.
Figure 15:
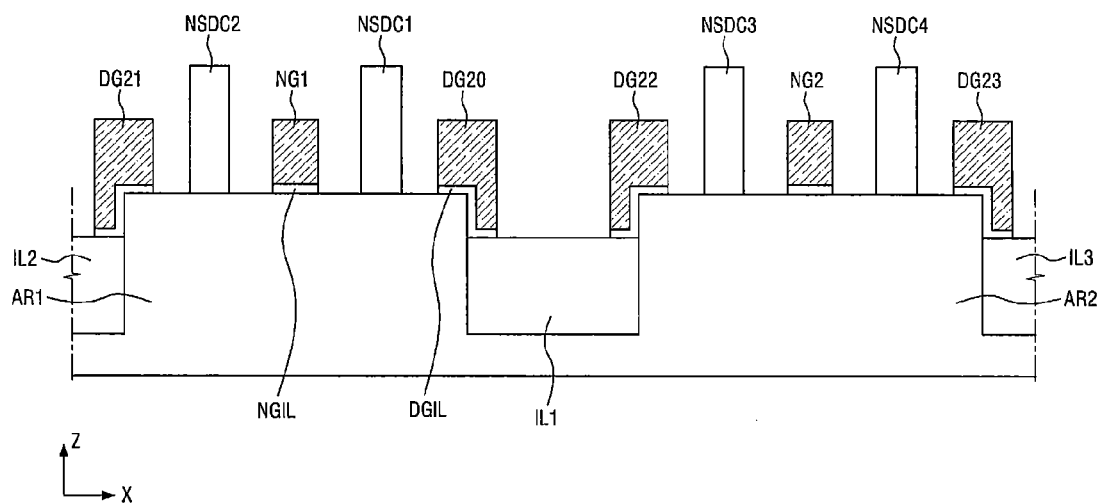
FIG. 15 is a cross-sectional view taken along the line CC' of FIG. 12.
Figure 16:
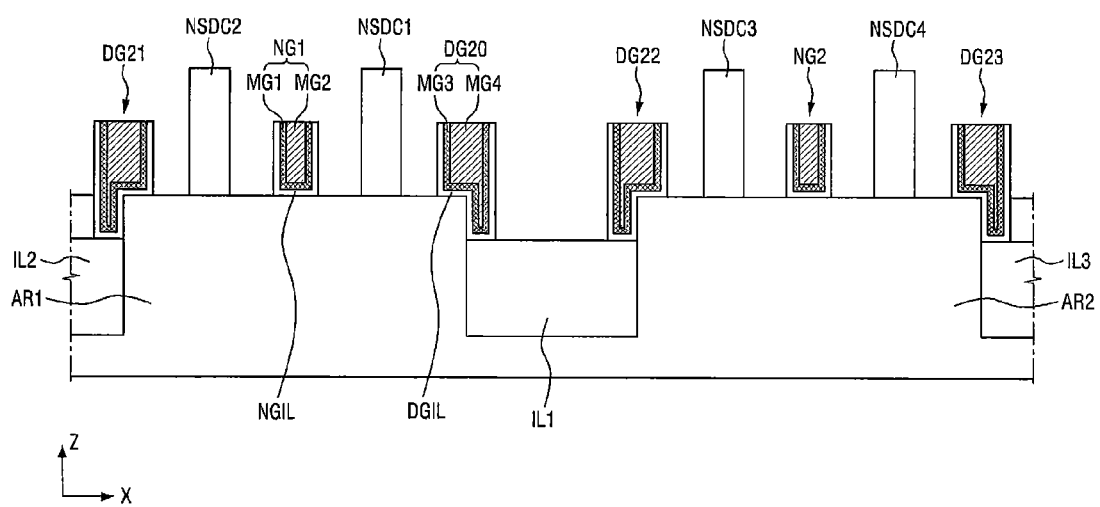
FIG. 16 is a cross-sectional view taken along the line CC' of FIG. 12.

FIG. 13 is a cross-sectional view taken along the line CC' of FIG. 12, FIG. 14 is a cross-sectional view taken along the line CC' of FIG. 12, FIG. 15 is a cross-sectional view taken along the line CC' of FIG. 12, and FIG. 16 is a cross-sectional view taken along the line CC' of FIG. 12.

FIG. 13 illustrates a case in which the semiconductor device 4 has a gate-first structure and is a planar transistor, FIG. 14 illustrates a case in which the semiconductor device 4 has a gate-last structure and is a planar transistor, FIG. 15 illustrates a case in which the semiconductor device 4 has a gate-first structure and is a FinFET, and FIG. 16 illustrates a case in which the semiconductor device 4 is a gate-last structure and is a FinFET. The semiconductor device 4 shown in FIGS. 13 to 16 are substantially the same as those shown in FIGS. 2 to 9, and detailed descriptions thereof will not be given.

Hereinafter, a semiconductor device 5 according to some embodiments of the present invention will be described with reference to FIG. 17. The semiconductor device 5 according to some embodiments of the present invention can be a PMOS transistor.

Figure 17:
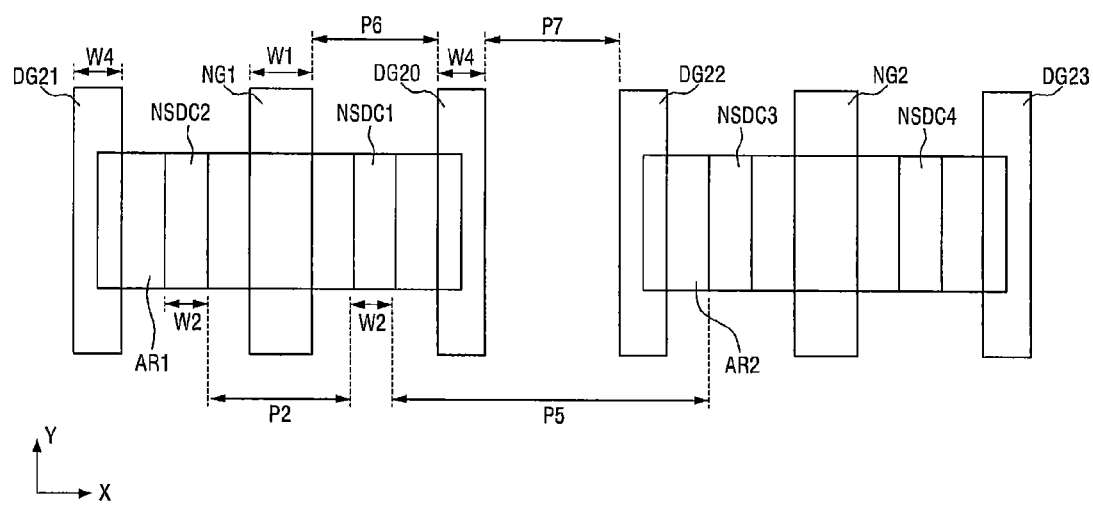
FIG. 17 is a plan view of a semiconductor device according to some embodiments of the present invention.

FIG. 17 is a plan view of a semiconductor device according to some embodiments of the present invention.

Referring to FIGS. 17, 20th to 23rd dummy gates DG20 to DG23 have smaller sizes than first and second normal gates NG1 and NG2.

For example, widths of the 20th to 23rd dummy gates DG20 to DG23 in a first direction X may be equal to a fourth width W4, which is smaller than widths of first and second normal gates NG1 and NG2, that is, a first width W1.

A distance between the 20th dummy gate DG20 and the first normal gate NG1 in the first direction X, that is, a sixth distance P6, and a distance between the 20th dummy gate DG20 and the 22nd dummy gate DG22 in the first direction X, that is, a seventh distance P7, may be different from each other. In more detail, the sixth distance P6 may be smaller than the seventh distance P7.

The sixth distance P6 may be greater than the third distance P3 of FIG. 12 and the seventh distance P7 may be greater than the fourth distance P4 of FIG. 12.

Here, a distance between the first normal gate NG1 and the 21st dummy gate DG21 in the first direction X may be equal to the distance between the first normal gate NG1 and the 20th dummy gate DG20 in the first direction X.

Consequently, the semiconductor device 5 shown in FIG. 17 includes 20th to 23rd dummy gates DG20 to DG23 having smaller sizes than the first and second normal gates NG1 and NG2.

Since the semiconductor device 5 is a PMOS transistor, performance of the semiconductor device 5 may be improved as the compressive stress applied to a channel region of a first active region AR1 disposed under the first normal gate NG1 is less reduced. Therefore, if the 20th to 23rd dummy gates DG20 to DG23 include a metallic material that applies compressive stress, the 20th to 23rd dummy gates DG20 to DG23 is preferably configured to apply less compressive stress to the channel region of the first active region AR1 disposed under the first normal gate NG1. This is because the compressive stress applied by the 20th to 23rd dummy gates DG20 to DG23 may serve as tensile stress from the viewpoint of the channel region of the first active region AR1 disposed under the first normal gate NG1, that is, tensile stress reducing the compressive stress applied to the channel region.

Therefore, even if the 20th to 23rd dummy gates DG20 to DG23 include the same metal with the first and second normal gates NG1 and NG2, they preferably have smaller sizes than the first and second normal gates NG1 and NG2 to apply reduced compressive stress.

As described above, since the semiconductor device 5 includes the dummy gates DG20 to DG23 having smaller sizes than the normal gates NG1 and NG2, the compressive stress applied to the channel region disposed under the normal gates NG1 and NG2 may be less reduced.

Even when the semiconductor device 5 is an NMOS transistor and 20th to 23rd dummy gates DG20 to DG23 include a metallic material that applies tensile stress, it is possible to allow the tensile stress applied to the to the channel region disposed under the normal gates NG1 and NG2 to be less reduced.

When the semiconductor device 1 is an NMOS transistor, the performance of the semiconductor device 1 may be improved as the tensile stress applied to the channel region of first active region AR1 disposed under the first normal gate NG1 is increased. Therefore, the tensile stress applied to the channel region of first active region AR1 may be less reduced as the 20th to 23rd dummy gates DG20 to DG23 including a metallic material that applies tensile stress have smaller sizes.

A planar transistor, a FinFET, a gate-first structure, and a gate-last structure may all be applied to the semiconductor device 5.

Hereinafter, a semiconductor device 6 according to some embodiments of the present invention will be described with reference to FIG. 18.

Figure 18:
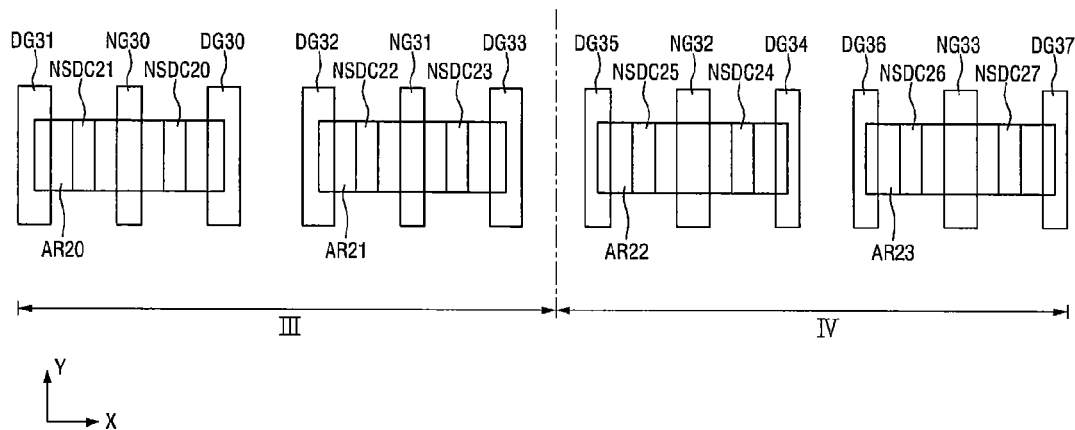
FIG. 18 is a plan view of a semiconductor device according to some embodiments of the present invention.

FIG. 18 is a plan view of a semiconductor device according to some embodiments of the present invention.

Referring to FIG. 18, semiconductor device 6 may have a third region III and a fourth region IV.

The semiconductor device 6 may include a CMOS transistor. The third region III may include one of a PMOS transistor and an NMOS transistor and the fourth region IV may include the other of the PMOS transistor and the NMOS transistor.

For example, 30th to 33rd dummy gates DG30 to DG33 of the third region III have larger sizes than 30th to 31st normal gates NG30 and NG31, and 34th to 37th dummy gates DG34 to DG37 of the fourth region IV may have smaller sizes than 32nd and 33rd normal gates NG32 and NG33. Therefore, if the 30th to 37th dummy gates DG30 to DG37 include a metallic material that applies compressive stress, the third region III may include a NMOS transistor and the fourth region IV may include a PMOS transistor. Conversely, if the 30th to 37th dummy gates DG30 to DG37 include a metallic material that applies tensile stress, the third region III may be a PMOS transistor and the fourth region IV may be an NMOS transistor.

In other words, the semiconductor device 4 shown in FIG. 12 may be disposed in the third region III and the semiconductor device 5 shown in FIG. 17 may be disposed in the fourth region IV.

Hereinafter, a semiconductor device 7 according to some embodiments of the present invention will be described with reference to FIG. 19. The semiconductor device 7 according to some embodiments of the present invention can be an NMOS transistor.

Figure 19:
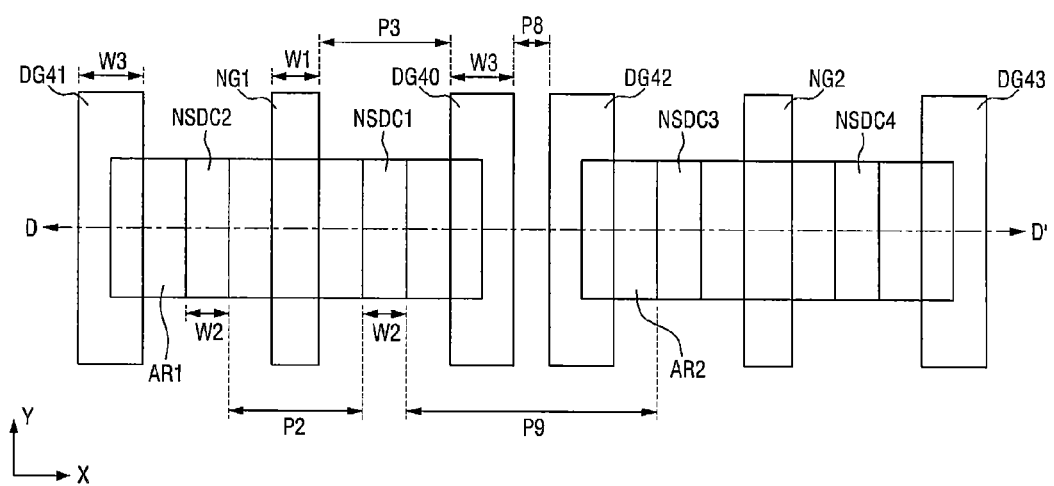
FIG. 19 is a plan view of a semiconductor device according to some embodiments of the present invention.

FIG. 19 is a plan view of a semiconductor device according to some embodiments of the present invention.

Referring to FIG. 19, a distance between 40th and 42nd dummy gates DG40 to DG42 in the first direction X, that is, an eighth distance P8, may be smaller than a distance between 20th and 22nd dummy gates DG20 and DG22 in the first direction X, that is, a fourth distance P4.

The 40th and 42nd dummy gates DG40 to DG42 are generated to be adjacent to each other. That is to say, for example, a spacer (not shown) disposed at one side of the 40th dummy gate DG40 and a spacer (not shown) disposed at one side of the 42nd dummy gate DG42 may be generated to be brought into contact with each other. Therefore, the eighth distance P8 may be smaller than the fourth distance P4 of FIG. 12. Accordingly, a distance between the first and third normal source/drain contacts NSDC1 and NSDC3 in the first direction X, that is, a ninth distance P9, may be smaller than the fifth distance P5 of FIG. 12.

A distance between the first normal gate NG1 and the 42nd dummy gate DG42 in the first direction X may be reduced, compared to a distance between the first normal gate NG1 and the 22nd dummy gate DG22 in the first direction X, shown in FIG. 12. Therefore, as compared to FIG. 12, the stress applied to the channel region of the first active region AR1 disposed under the first normal gate NG1 by the 42nd dummy gate DG42 may become more influential than the stress applied to the channel region of the second active region AR2 disposed under the second normal gate NG2 by the 40th dummy gate DG40.

That is to say, the stress applied by the 22nd dummy gate DG22 to the channel of the first active region AR1 disposed under the first normal gate NG1, as shown in FIG. 12, may be larger than the stress applied by the 42nd dummy gate DG42 to the channel of the first active region AR1 disposed under the first normal gate NG1, as shown in FIG. 19.

As described above, since the semiconductor device 7 includes a dummy gate having a larger size than the normal gates NG1 and NG2 and including a metallic material that applies compressive stress (for example, the 40th dummy gate DG40), and a dummy gate of another active region adjacent thereto (for example, the 42nd dummy gate DG42), positioned to be close to the normal gates NG1 and NG2, the tensile stress applied to the channel region disposed under the normal gates NG1 and NG2 may be increased, thereby improving the performance of the semiconductor device 7 itself (for example, mobility of carriers in the channel region).

Even when the semiconductor device 7 is a PMOS transistor and the 40th to 43rd gates DG40 to DG43 include a metallic material that applies tensile stress, the performance of the semiconductor device 7 itself may be improved.

When the semiconductor device 7 is a PMOS transistor, the performance of the semiconductor device 7 may be improved as the compressive stress applied to the channel region of the first active region AR1 disposed under the first normal gate NG1 is increased. Therefore, as the 40th to 43rd dummy gates DG40 to DG43 including a metallic material that applies tensile stress have larger sizes and a distance between the 40th and 42nd dummy gates DG40 to DG42 in the first direction X is reduced, the compressive stress applied to the channel region of the first active region AR1 may be increased, thereby improving the performance of the semiconductor device 7.

Hereinafter, various embodiments of the semiconductor device 7 will be described with reference to FIGS. 20 to 23.

Figure 20:
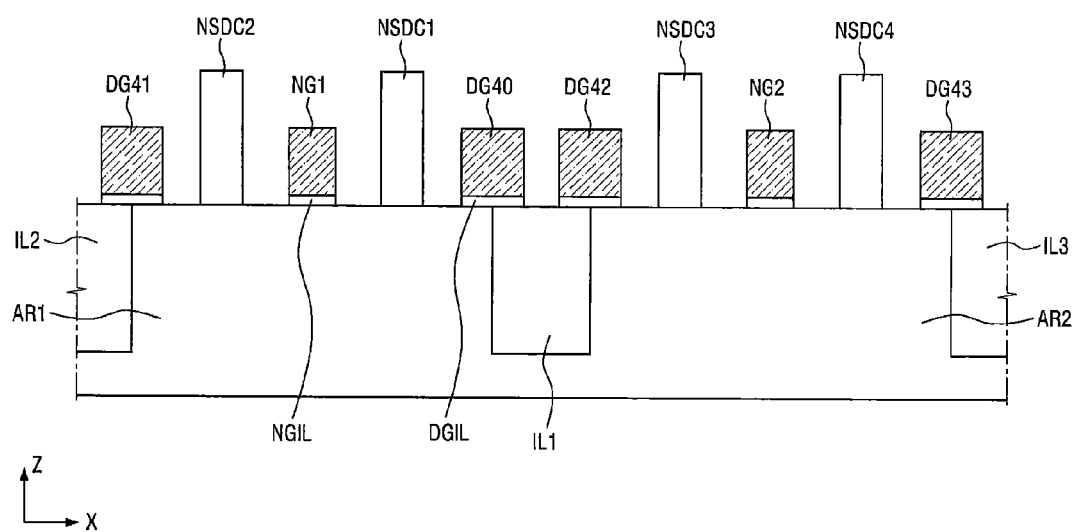
FIG. 20 is a cross-sectional view taken along the line DD' of FIG. 19.
Figure 21:
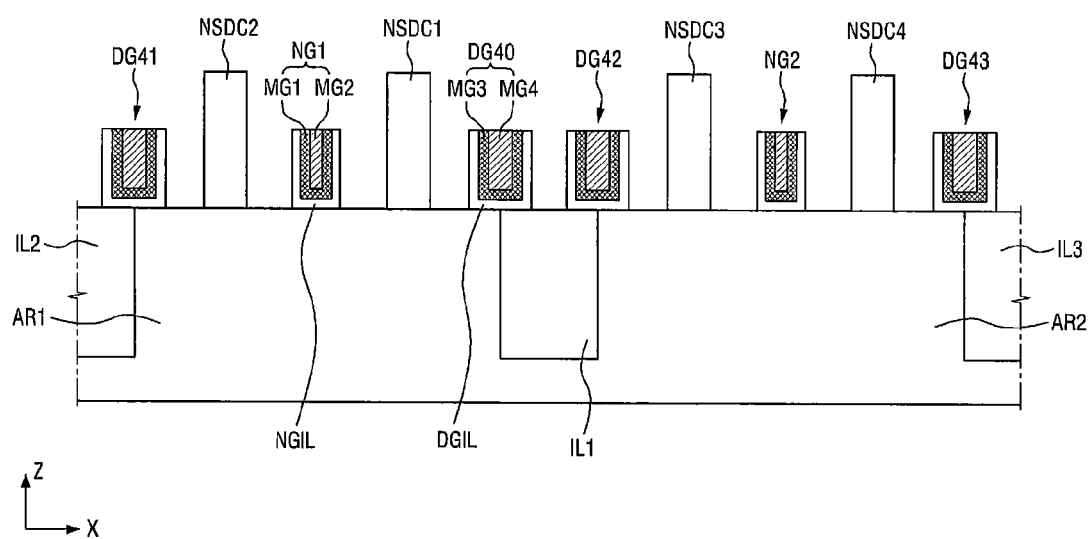
FIG. 21 is a cross-sectional view taken along the line DD' of FIG. 19.
Figure 22:
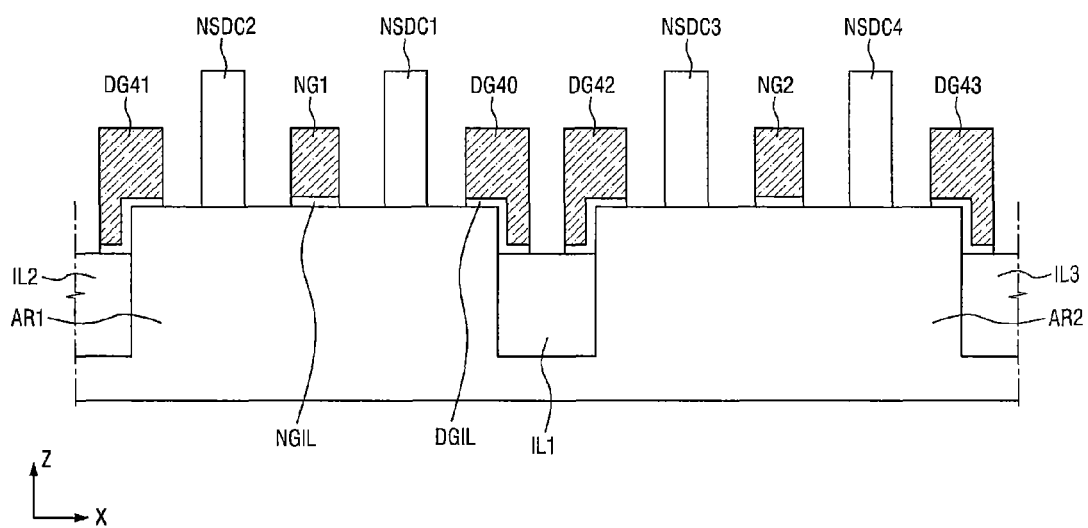
FIG. 22 is a cross-sectional view taken along the line DD' of FIG. 19.
Figure 23:
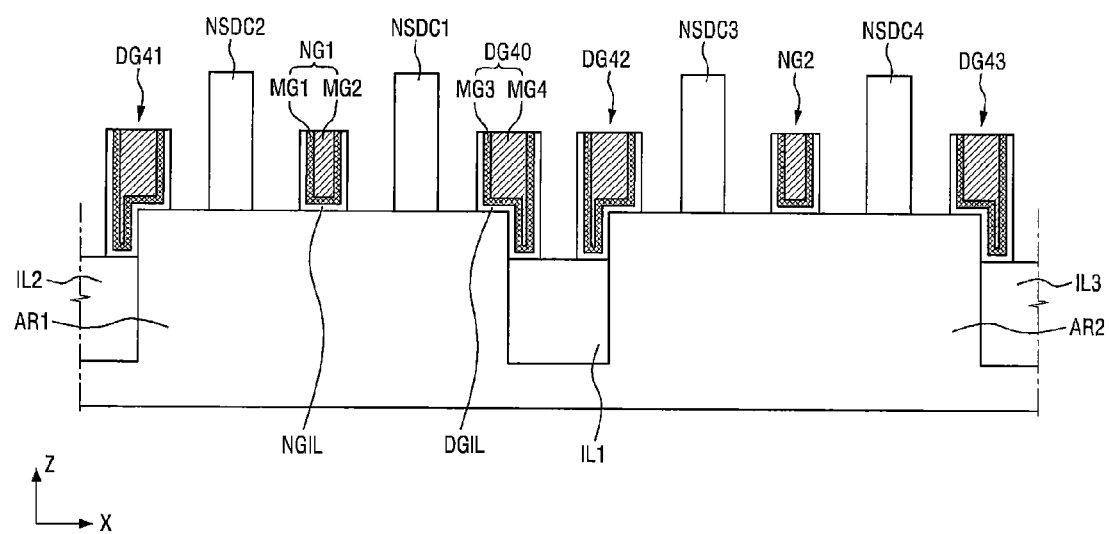
FIG. 23 is a cross-sectional view taken along the line DD' of FIG. 19.

FIG. 20 is a cross-sectional taken along the line DD' of FIG. 19, FIG. 21 is a cross-sectional view taken along the line DD' of FIG. 19, FIG. 22 is a cross-sectional view taken along the line DD' of FIG. 19, and FIG. 23 is a cross-sectional view taken along the line DD' of FIG. 19.

FIG. 20 illustrates a case in which the semiconductor device 7 has a gate-first structure and is a planar transistor, FIG. 21 illustrates a case in which the semiconductor device 7 has a gate-last structure and is a planar transistor, FIG. 22 illustrates a case in which the semiconductor device 7 has a gate-first structure and is a FinFET, and FIG. 23 illustrates a case in which the semiconductor device 7 has a gate-last structure and is a FinFET.

Hereinafter, a semiconductor device 8 according to some embodiments of the present invention will be described with reference to FIG. 24.

Figure 24:
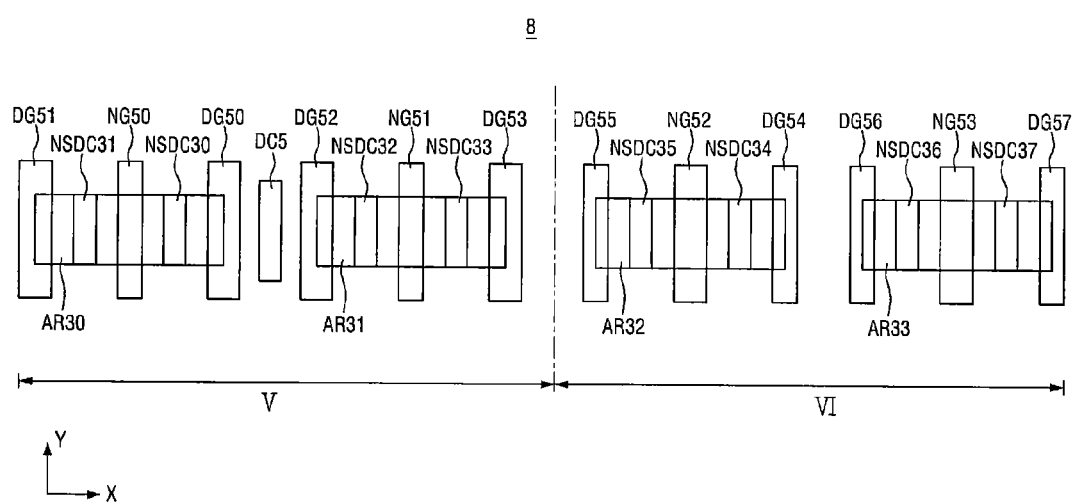
FIG. 24 is a plan view of a semiconductor device according to some embodiments of the present invention.

FIG. 24 is a plan view of a semiconductor device according to some embodiments of the present invention.

Referring to FIG. 24, the semiconductor device 8 may include a fifth region V and a sixth region VI The semiconductor device 8 may include a CMOS transistor. In detail, the fifth region V may include one of a PMOS transistor and an NMOS transistor and the sixth region VI may include the other of the PMOS transistor and the NMOS transistor.

For example, a fifth dummy contact DC5 of the fifth region V has a larger size than 30th to 33rd normal source/drain contacts NSDC30 to NSDC33, and 54th to 57th dummy gates DG54 to DG57 of the sixth region VI may have smaller sizes than 52nd and 53rd normal gates NG52 and NG53. Therefore, the fifth dummy contact DC5 and the 54th to 57th dummy gates DG54 to DG57 include a metallic material that applies compressive stress, the fifth region V may be an NMOS transistor and the sixth region VI may be a PMOS transistor. Conversely, if the fifth dummy contact DC5 and the 54th to 57th dummy gates DG54 to DG57 include a metallic material that applies tensile stress, the fifth region V may be a PMOS transistor and the sixth region VI may be an NMOS transistor.

Further, features of the above-described embodiments are well combined, so that the fifth region V may include one of the semiconductor devices 1 and 2 and the sixth region VI may include one of the semiconductor devices 4, 5 and 7.

An electronic system including semiconductor devices according to some embodiments of the present invention will be described with reference to FIG. 25.

Figure 25:
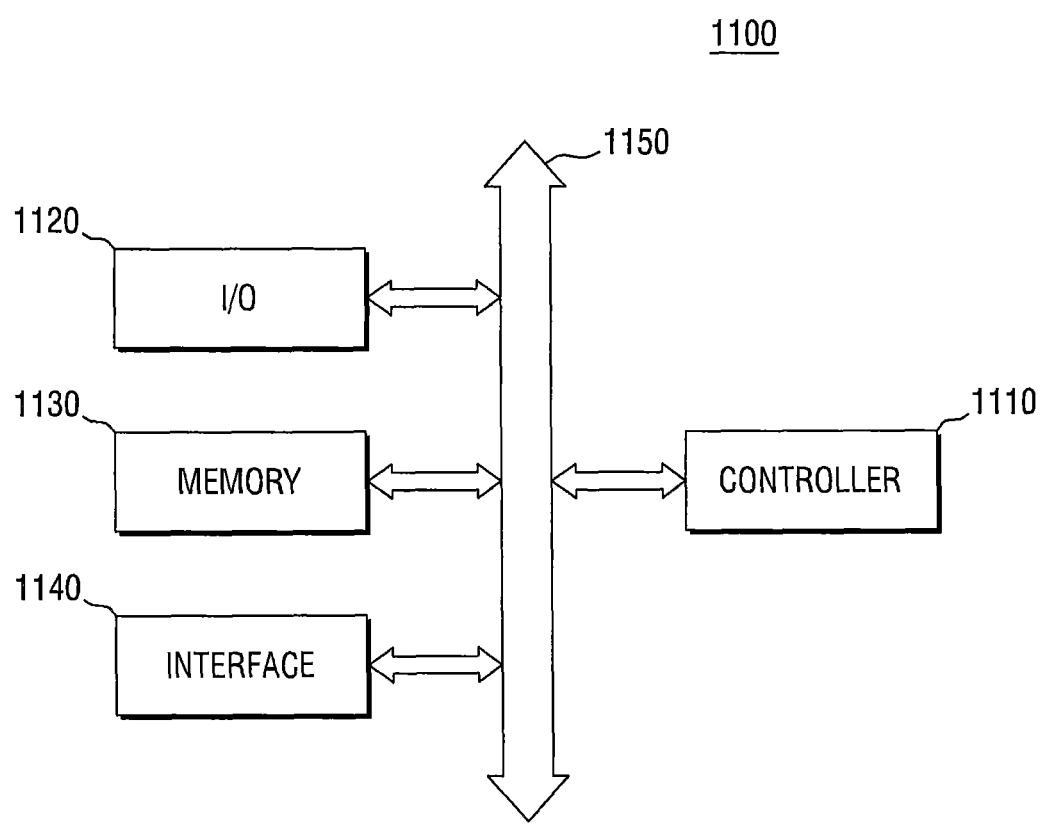
FIG. 25 is a block diagram of an electronic system including semiconductor devices according to some embodiments of the present invention.

FIG. 25 is a block diagram of an electronic system including semiconductor devices according to some embodiments of the present invention.

Referring to FIG. 25, the electronic system 1100 according to some embodiments of the present invention may include a controller 1110, an input/output device (I/O) 1120, a memory 1130, an interface 1140, and a bus 1150. The controller 1110, the I/O 1120, the memory 1130 and/or the interface 1140 may be connected to each other through the bus 1150. The bus 1150 corresponds to a path along which data moves.

The controller 1110 may include at least one of a microprocessor, a digital signal processor, a microcontroller, and logic devices capable of performing functions similar to those of these components. The I/O 1120 may include a keypad, a keyboard, a display, and so on. The memory 1130 may store data and/or commands. The interface 1140 may transmit data to a communication network or receive data from the communication network. The interface 1140 may be wired or wireless. For example, the interface 1140 may include an antenna or a wired/wireless transceiver. Although not shown, the electronic system 1100 is a working memory for improving the operation of the controller 1110 and may further include a high-speed DRAM and/or SRAM.

The semiconductor devices 1 to 8 according to some embodiments of the present invention may be provided in the memory 1130 or may be provided as some components of the controller 1110, the I/O 1120, or the like.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 26:
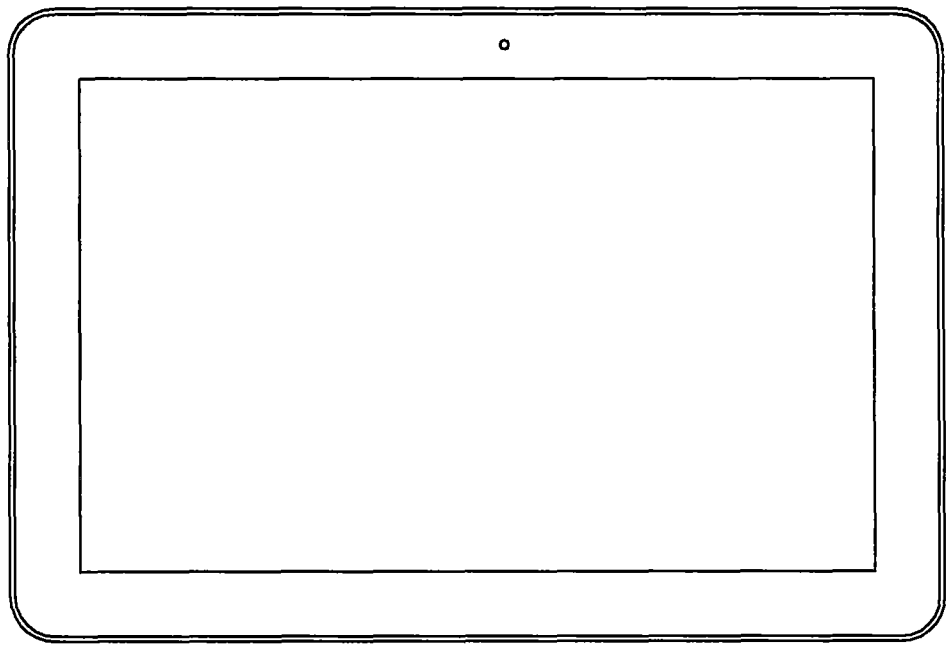
FIGS. 26 and 27 illustrate exemplary semiconductor systems to which semiconductor devices according to some embodiments of the present invention can be applied.
Figure 27:
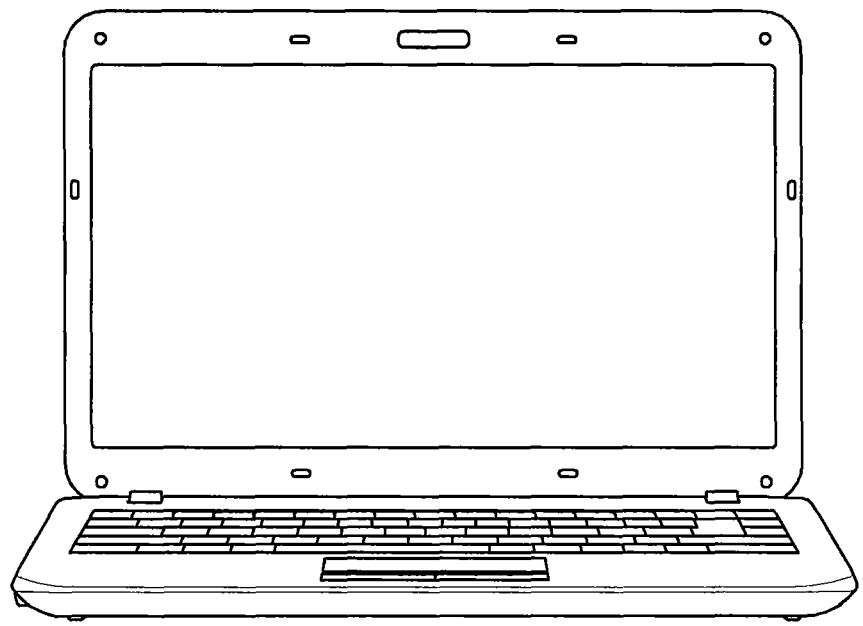

FIGS. 26 and 27 illustrate exemplary semiconductor systems to which the semiconductor devices according to some embodiments of the present invention can be applied. Specifically, FIG. 26 illustrates a tablet PC and FIG. 27 illustrates a notebook computer. At least one of the semiconductor devices 1 to 8 according to some embodiments of the present invention can be applied to the tablet PC or the notebook computer. It is obvious to one skilled in the art that semiconductor devices according to some embodiments of the present invention may also be applied to other kinds of electronic devices not illustrated herein.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
   first and second active regions spaced apart from each other in a first direction with an isolation layer interposed therebetween;
   a first normal gate on the first active region, the first normal gate extending in a second direction crossing the first direction;
   a first dummy gate comprising a first portion overlapping a first end of the isolation layer and a second portion overlapping the first active region and being spaced apart from the first normal gate in the first direction;
   a second dummy gate comprising a first portion overlapping a second end of the isolation layer and a second portion overlapping the second active region;
   a first normal source/drain contact on a first source/drain region between the first normal gate and the first dummy gate; and
   a dummy contact on the isolation layer and between the first and second dummy gates, the dummy contact not overlapping the first and second dummy gates and including a metallic material that applies stress to the first active region disposed under the first normal gate.

2. The semiconductor device of claim 1, wherein a distance between the first normal gate and the first dummy gate is equal to a distance between the first dummy gate and the second dummy gate.

3. The semiconductor device of claim 1, wherein the first normal gate and the first dummy gate include a metal.

4. The semiconductor device of claim 3, wherein the first normal gate and the first dummy gate have an equal size.

5. The semiconductor device of claim 1, further comprising:
   a second normal gate on the second active region, the second normal gate extending in the second direction and being spaced apart from the second dummy gate in the first direction; and
   a second normal source/drain contact on a second source/drain region between the second normal gate and the second dummy gate.

6. The semiconductor device of claim 1, the dummy contact has a first size that is different from a second size of the first normal source/drain contact.

7. The semiconductor device of claim 6, wherein the first size of the dummy contact is greater than the second size of the first normal source/drain contact, and
   wherein the first normal gate comprises an NMOS transistor, and the metallic material in the dummy contact applies compressive stress to the first active region disposed under the first normal gate.

8. The semiconductor device of claim 6, wherein the first size of the dummy contact is less than the second size of the first normal source/drain contact, and
   wherein the first normal gate comprises an NMOS transistor, and the metallic material in the dummy contact applies tensile stress to the first active region disposed under the first normal gate.

9. A semiconductor device comprising:
   a substrate including a first region and a second region;
   first and second active regions disposed in the first region and spaced apart from each other in a first direction with a first isolation layer interposed therebetween;
   a first normal gate on the first active region, the first normal gate extending in a second direction crossing the first direction;
   a first normal source/drain contact on a first source/drain region disposed at one side of the first normal gate;
   a first dummy contact on the first isolation layer, the first dummy contact having a size larger than a size of the first normal source/drain contact;
   third and fourth active regions disposed on the second region and spaced apart from each other in the first direction with a second isolation layer interposed therebetween;
   a second normal gate on the second active region extending in the second direction;
   a second normal source/drain contact on a second source/drain region disposed at one side of the second normal gate; and
   a second dummy contact on the second isolation layer, the second dummy contact having a size smaller than a size of the second normal source/drain contact.

10. The semiconductor device of claim 9, wherein the first region includes an NMOS region, and the second region includes a PMOS region.

11. The semiconductor device of claim 9, wherein the first dummy contact has the size larger than the size of the second dummy contact.

12. A semiconductor device comprising:
first and second active regions spaced apart from each other in a first direction with a first isolation layer interposed therebetween;
a first normal gate on the first active region, the first normal gate extending in a second direction crossing the first direction;
a first dummy gate having a first portion overlapping a first end of the first isolation layer and a second portion overlapping the first active region and being spaced apart from the first normal gate in the first direction;
a second dummy gate having a first portion overlapping a second end of the first isolation layer and a second portion overlapping the second active region;
a second normal gate on the second active region, the second normal gate extending in the second direction; and
a third dummy gate on the first active region and spaced apart from the first dummy gate with the first normal gate interposed therebetween,
wherein the first and second dummy gates have a width different from a width of the first normal gate in the first direction.

13. The semiconductor device of claim 12, wherein a distance between the first normal gate and the first dummy gate is different from a distance between the first dummy gate and the second dummy gate.

14. The semiconductor device of claim 12, wherein a distance between the third dummy gate and the first normal gate is equal to a distance between the first normal gate and the first dummy gate.

15. The semiconductor device of claim 14, further comprising:
a first normal source/drain contact on a first source/drain region between the third dummy gate and the first normal gate;
a second normal source/drain contact on a second source/drain region between the first normal gate and the first dummy gate; and
a third normal source/drain contact on a third source/drain region between the second dummy gate and the second normal gate.

16. The semiconductor device of claim 12, wherein a width of the third dummy gate is equal to a width of the first dummy gate in the first direction.

17. The semiconductor device of claim 12, wherein the first dummy gate and the second dummy gate are adjacent to each other.

18. The semiconductor device of claim 12, wherein the first and second dummy gates and the first normal gate include a metallic material.

19. The semiconductor device of claim 12, wherein the first and second dummy gates include a metallic material that applies compressive stress to the first active region disposed under the first normal gate.

20. The semiconductor device of claim 12, wherein the first and second dummy gates include a metallic material that applies tensile stress to the first active region disposed under the first normal gate.

* * * * *